United States Patent
Reddy et al.

(10) Patent No.: US 6,987,316 B2
(45) Date of Patent: Jan. 17, 2006

(54) MULTILAYER CERAMIC SUBSTRATE WITH SINGLE VIA ANCHORED PAD AND METHOD OF FORMING

(75) Inventors: Srinivasa N. Reddy, LaGrangeville, NY (US); Mukta G. Farooq, Hopewell Junction, NY (US); Kevin M. Prettyman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 10/707,810

(22) Filed: Jan. 14, 2004

(65) Prior Publication Data

US 2005/0151241 A1 Jul. 14, 2005

(51) Int. Cl.
  *H01L 23/06* (2006.01)
  *H01L 23/10* (2006.01)
  *H01L 23/15* (2006.01)

(52) U.S. Cl. .................. 257/703; 257/700; 257/758
(58) Field of Classification Search ............. 257/703, 257/700, 758
See application file for complete search history.

(56) References Cited

U.S. PATENT DOCUMENTS

| | | | |
|---|---|---|---|
| 4,900,878 A | | 2/1990 | Ichkhan |
| 5,706,178 A | | 1/1998 | Barrow |
| 5,738,530 A | | 4/1998 | Schreiber et al. |
| 6,096,565 A | * | 8/2000 | Goland et al. ............. 438/2 |
| 6,181,016 B1 | | 1/2001 | Lin et al. |
| 6,187,418 B1 | * | 2/2001 | Fasano et al. .......... 428/210 |
| 6,252,178 B1 | | 6/2001 | Hashemi |
| 6,312,791 B1 | | 11/2001 | Fasano et al. |
| 6,361,331 B2 | | 3/2002 | Fork et al. |
| 6,501,186 B1 | | 12/2002 | Yu et al. |
| 6,551,916 B2 | * | 4/2003 | Lin et al. ............... 438/612 |

* cited by examiner

*Primary Examiner*—David Nelms
*Assistant Examiner*—Tu-Tu Ho
(74) *Attorney, Agent, or Firm*—Ira D. Blecker

(57) ABSTRACT

A multilayer ceramic substrate in which an outer metal pad is anchored to the substrate by a single metal-filled via in the first ceramic layer adjacent to the metal pad. In turn, this single metal-filled via is anchored to the substrate by a larger, single metal-filled via in the next ceramic layer adjacent to the first ceramic layer. Preferably, the metal-filled vias and metal pad are 100 volume percent metal.

18 Claims, 2 Drawing Sheets

MULTILAYER CERAMIC SUBSTRATE WITH SINGLE VIA ANCHORED PAD AND METHOD OF FORMING

BACKGROUND OF INVENTION

The present invention relates to the fabrication of multilayer ceramic substrates and, more particularly, relates to the forming of an electrically conductive surface pad that has improved mechanical and electrical reliability and is suitable for high frequency applications.

Multilayer ceramic substrates are typically used for interconnection between integrated circuit devices used in information processing systems such as computers, control systems and circuit boards. A method to make multilayer ceramic substrates involves forming the dielectric material into a tape by using a casting process, punching (or perforating) the tape to form holes or vias into which a conductive metal paste is deposited along with metal traces that act as wiring. A number of these punched and metallized tapes are aligned, stacked and pressed into a laminate that is subsequently sintered. The sintering is by a cofired process in which the ceramic and metal powders are consolidated in essentially a single but often complex heating process.

A key element of the sintering process involves the formation on the ceramic of conductive surface features (e.g., input/output (I/O) pads) onto which metal plating such as nickel and gold may be deposited, sometimes as preparation for subsequent solder attach processes. These surface features provide connections to the electrical conductors within the ceramic and their mechanical and electrical performance are very important to the reliability of the multilayer ceramic substrate and the entire information processing system.

The strength of the bond between the surface features and the ceramic is important when the surface features, typically present as an array, are electrically connected to a printed circuit board by a solder technique such as ceramic ball grid array (CBGA) or ceramic column grid array (CCGA).

High metal content surface features are desirable because of improved electrical conductivity as well as better plateability of the surface features. However, there is often a weak bond between high metal content surface features and the underlying ceramic. It has been found by Fasano et al. U.S. Pat. No. 6,312,791, the disclosure of which is incorporated by reference herein, that the reliability of high content metal features can be improved by anchoring them to an inner pad which is well bonded to the ceramic material. As taught by Fasano et al. and as illustrated in FIG. 1 herein, anchoring of the metal feature 10 may occur by a plurality of vias 12, some of which 14 may be electrically nonfunctioning. In one embodiment taught by Fasano et al. and as shown in FIG. 2 herein, the surface feature 10 is held in place by one large via 16 bonded to an inner pad 18 which, in turn, is held in place by a plurality of vias 20, again some of which 22 may be electrically nonfunctioning.

The present inventors have found that the structure disclosed in Fasano et al. is not preferable for high frequency applications in the gigahertz frequency range. To meet electrical requirements for high frequency applications, it is necessary to have a structure with only single vias. However, such single via structures present mechanical reliability challenges as noted in Fasano et al.

Various other solutions have been proposed for anchoring a bond pad or other feature to a substrate. Yu et al. U.S. Pat. No. 6,501,186 discloses a bond pad which is anchored by a plurality of vias which improve the mechanical strength of the bond pad. Fork et al. U.S. Pat. No. 6,361,331 discloses a metal strap which is used to anchor a spring metal finger and pad to a substrate. Hashemi U.S. Pat. No. 6,252,178 discloses a semiconductor device with bonding anchors in build-up layers by using non-stacked vias in the build-up layers. Lin et al. U.S. Pat. No. 6,181,016 discloses a bond pad with a single anchoring structure which comprises a plurality of interconnected line segments. Schreiber et al. U.S. Pat. No. 5,738,530 discloses a contact pad having an elastomeric electrical contact anchored by an electrically conductive metallic trace. Barrow U.S. Pat. No. 5,706,178 discloses an elliptically shaped solder pad which is partially covered by a so-called solder mask so that the solder pads are anchored by the solder mask. Ichkhan U.S. Pat. No. 4,900,878 discloses plated-through holes which are anchored by anchor pads around the plated-through holes. All of the foregoing references are incorporated by reference herein.

Notwithstanding all of the prior efforts of those skilled in the art, there still remains a need for a mechanically robust surface feature which is acceptable for high frequency applications in the gigahertz frequency range.

Accordingly, it is a purpose of the present invention to have a mechanically robust surface feature.

It is another purpose of the present invention to have an anchored surface feature which is acceptable for high frequency applications in the gigahertz frequency range and is also mechanically robust.

These and other purposes will become more apparent after referring to the following description of the invention considered in conjunction with the accompanying drawings.

SUMMARY OF INVENTION

The purposes of the invention have been achieved by providing, according to a first aspect of the present invention, a multilayer ceramic substrate with a single via anchored pad comprising:

a first ceramic layer having a metal-filled via and an outer surface;

an outer pad adjacent to the outer surface of the first ceramic layer, the outer pad adhered to the metal-filled via in the first ceramic layer;

a second ceramic layer adjacent to the first ceramic layer having a metal-filled via adhered to the metal-filled via in the first ceramic layer, the metal-filled via in the second ceramic layer being larger in crossection than the metal-filled via in the first ceramic layer, wherein there is only one metal-filled via in each of the first and second ceramic layers to anchor the outer pad to the multilayer ceramic substrate; and a third ceramic layer adjacent to the second ceramic layer having a metal-filled via adhered to the metal-filled via in the second ceramic layer.

According to a second aspect of the invention, there is provided a multilayer ceramic substrate with a single via anchored pad comprising:

a first ceramic layer having a metal-filled via and an outer surface, the metal-filled via having a first contact surface;

an outer pad adjacent to the outer surface of the first ceramic layer, the outer pad adhered to the metal-filled via in the first ceramic layer;

a second ceramic layer adjacent to the first ceramic layer having a metal-filled via with a second contact surface, the metal-filled via in the second ceramic layer adhered to the metal-filled via in the first ceramic layer through the first and second contact surfaces, wherein the second contact surface is larger than the first contact surface and wherein there is only one metal-filled via in each of the first and second ceramic layers to anchor the outer pad to the multilayer ceramic substrate; and a third ceramic layer adjacent to the second ceramic layer having a metal-filled via adhered to the metal-filled via in the second ceramic layer.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 3:
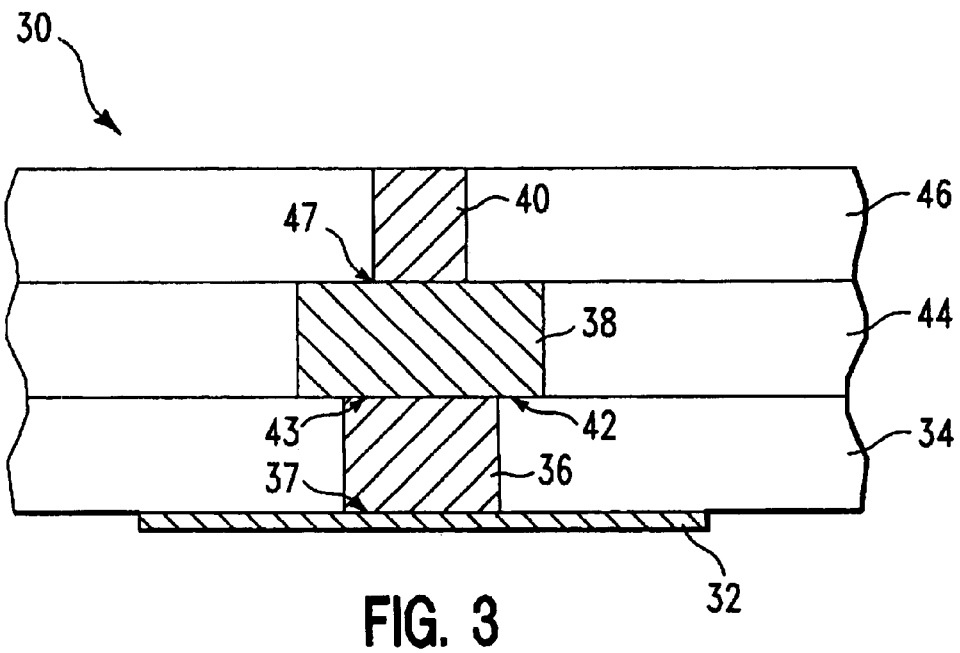
FIG. 3 is a cross sectional view of a first embodiment according to the present invention in which a surface metal feature is anchored with a single via.

Referring to the drawings in more detail, and particularly referring to FIG. 3, there is shown a first embodiment of a single via anchored surface feature according to the present invention. As shown in FIG. 3, a multilayer ceramic substrate 30 has an outer metal pad or surface feature 32 such as an I/O pad. The multilayer ceramic substrate 30 may be made by conventional processing as described previously. For reliability and other concerns, it is necessary that the metal pad 32 be firmly anchored to the multilayer ceramic substrate 30. Accordingly, a structure is proposed wherein the metal pad 32 is firmly anchored to the multilayer ceramic substrate 30 and yet is suitable for high frequency applications in the gigahertz frequency range.

Thus, the multilayer ceramic substrate 30 includes a first ceramic layer 34 having a metal-filled via 36. The metal pad 32 is adhered to metal-filled via 36 at an outer surface 37 of the metal-filled via 36. Second ceramic layer 44 includes a metal-filled via 38 adhered to the metal-filled via 36 of the first ceramic layer 34. It is necessary to the present invention that metal-filled via 38 be dimensionally larger than metal-filled via 36. By "dimensionally larger", it is meant that metal-filled via 38 is larger in at least one horizontal or width dimension so that metal-filled via 38 is at least partially retained by first ceramic layer 34. This result can be attained in at least a couple of ways. It is known that during the formation of multilayer ceramic substrates, the greensheet is punched or otherwise perforated to form a via and then filled with metallic material. This via may be cylindrically-shaped or nearly cylindrically shaped. That is, one end of the via may be slightly larger (the so-called breakout end) than the other end or the side of the via could be slightly curved. Notwithstanding, the shape of the via is more or less cylindrical. Then for purposes of the present invention, where the vias are considered to be cylindrical, metal-filled via 38 should be larger in diameter, by preferably at least two mils or more, than metal-filled via 36.

Alternatively, if the metal-filled vias were not considered to have a cylindrical shape, such as might occur if the breakout was exaggerated so that the metal-filled vias were in the shape of a truncated cone, it is necessary that contact surface 42 of metal-filled via 38 be larger than contact surface 43 of metal-filled via 36 so that, again, the metal-filled via 38 is at least partially retained by the first ceramic layer 34. Even in this case, the contact surfaces 42, 43 would be circular in shape due to the round punches that are used to make the vias in the ceramic greensheets.

The multilayer ceramic substrate 30 further includes a third ceramic layer 46 having a metal-filled via 40 which is adhered at interface 47 to metal-filled via 38 in the second ceramic layer 44. There will usually be additional conventional ceramic layers containing conventional metal-filled vias after third ceramic layer 46 as is well known to those skilled in the art. Those additional ceramic layers are omitted for clarity. Again, metal-filled via 40 is preferably cylindrical in shape. It is preferred that metal-filled via 36 in the first ceramic layer 34 has a diameter which is at least equal to but is preferably greater than the diameter of metal-filled via 40 in third ceramic layer 46.

As can be appreciated, metal pad 32 is firmly anchored to the multilayer ceramic substrate 30 by the succession of metal-filled via 36 in the first ceramic layer 34, metal-filled via 38 in the second ceramic layer 44 and metal-filled via 40 in the third ceramic layer 46. This is true regardless of whether metal pad 32 is adhered to first ceramic layer 34.

For the best electrical conductivity, it is most preferred that metal pad 32, metal-filled via 36 in the first ceramic layer 34 and metal-filled via 38 in the second ceramic layer all comprise 100 volume percent metal, preferably a copper/nickel alloy such as 90 volume percent copper and 10 volume percent nickel. For the higher performance ceramic materials, there will be a poor bond between these all-metallic features and the underlying ceramic material. However, this is not a concern as the metal pad 32 is firmly mechanically anchored to the multilayer ceramic substrate 30, although not actually bonded thereto, as noted above by the succession of metal-filled vias.

It is preferred that metal-filled via 40 of the third ceramic layer 46 be a composite of metal and ceramic materials. The composite is preferred because it adheres well to the high performance ceramic materials and thus will seal the substrate. For purposes of illustration and not limitation, the composite may comprise copper plus 40 to 60 volume percent ceramic material, most preferably a glass ceramic material.

Figure 4:
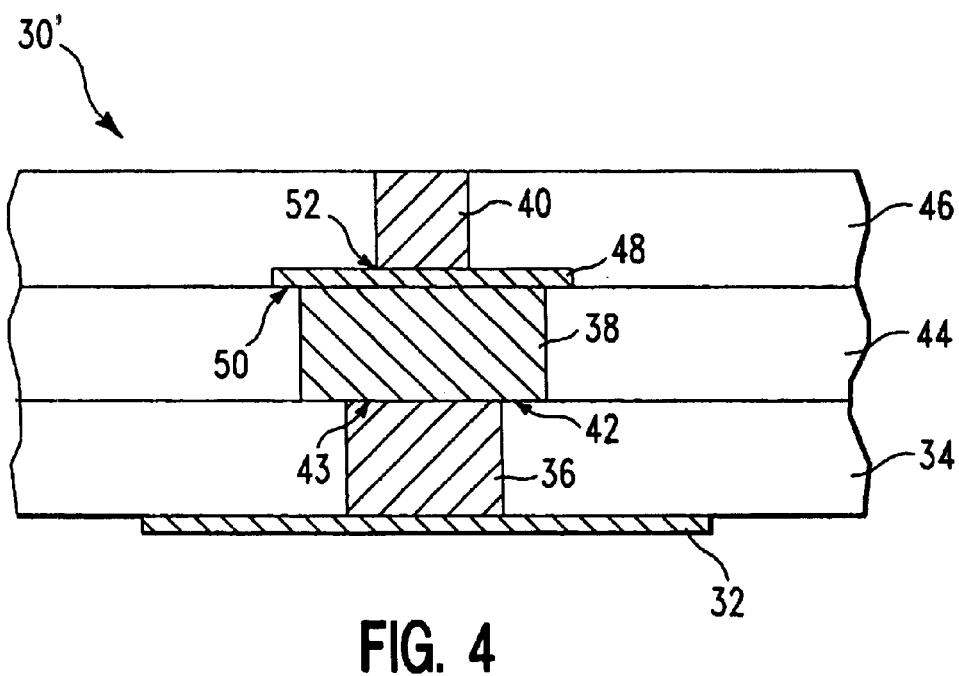
FIG. 4 is a cross sectional view of a second embodiment according to the present invention in which a surface metal feature is anchored with a single via.

Referring now to FIG. 4, a second embodiment of the present invention is illustrated. In the embodiment shown in FIG. 4, the multilayer ceramic substrate 30" further includes an interlayer pad 48 between the metal-filled via 38 in second ceramic layer 44 and metal-filled via 40 in third ceramic layer 46. Thus, metal-filled via 38 adheres to interlayer pad 48 at interface 50 and metal-filled via 40 adheres to interlayer pad 48 at interface 52. Interlayer pad 48 is desirable to provide robustness between metal-filled via 40 and metal-filled via 38, and hence also the anchoring of metal pad 32. As interlayer pad 48 must be electrically conducting, interlayer pad 48 should be metallic. Preferably, it is a composite of metal and ceramic materials and most preferably, it comprises the same composite material as metal-filled via 40. That is, for purposes of illustration and not limitation, the composite may comprise copper plus 40 to 60 volume percent ceramic material, most preferably a glass ceramic material. In all other respects, the embodiment of FIG. 4 is identical to the embodiment of FIG. 3. It is most preferred that the inter-layer layer pad 48 is used only in conjunction with power vias as its use in conjunction with signal vias could lead to increased capacitance.

Figure 1:
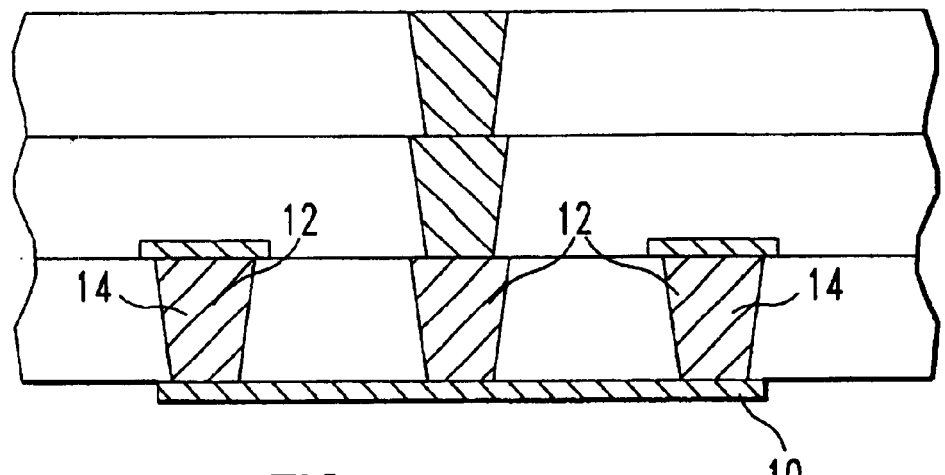
FIG. 1 is a cross sectional view of a conventional design in which a surface metal feature is anchored with a plurality of vias.
Figure 2:
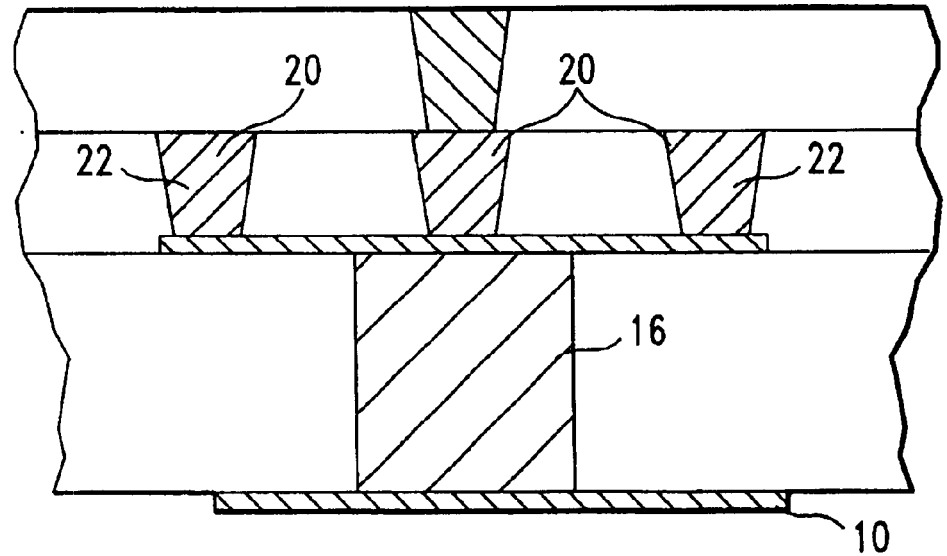
FIG. 2 is a cross sectional view of a conventional design in which a surface metal feature is anchored with a single large via in one layer and multiple vias in a second layer.

Computer modeling indicates that the present invention will result in improved transmission speed over the conventional anchored I/O pad structure as shown in FIGS. 1 and 2 for all frequencies above 10 gigahertz (GHZ). The improvement in general gets larger as the frequency increases. The performance improvement with the present invention is a result of the elimination of capacitance/inductance related losses in the aforementioned conventional anchored I/O pad structure which has I/O pads on multiple levels which act as capacitors and multiple vias that can act as inductors.

The present invention has been discussed with respect to the embodiments illustrated in FIGS. 3 and 4 wherein there is only one metal pad 32 in conjunction with the metal-filled single via structure. It should be understood that there will usually be a plurality of such metal pads 32 and that each metal pad 32 will be firmly anchored to the multilayer ceramic substrate with the metal-filled single via structure as previously described.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayer ceramic substrate with a single via anchored pad comprising:
    a first ceramic layer having a metal-filled via and an outer surface;
    an outer pad adjacent to the outer surface of the first ceramic layer, the outer pad adhered to the metal-filled via in the first ceramic layer;
    a second ceramic layer adjacent to the first ceramic layer having a metal-filled via adhered to the metal-filled via in the first ceramic layer, the metal-filled via in the second ceramic layer being larger in crossection than the metal-filled via in the first ceramic layer, wherein there is only one metal-filled via in each of the first and second ceramic layers to anchor the outer pad to the multilayer ceramic substrate; and
    a third ceramic layer adjacent to the second ceramic layer having a metal-filled via adhered to the metal-filled via in the second ceramic layer.

2. The multilayer ceramic substrate of claim 1 wherein the metal-filled vias in the first and second ceramic layers are cylindrical shaped.

3. The multilayer ceramic substrate of claim 2 wherein the metal-filled via in the second ceramic layer is at least two mils in diameter greater than the metal-filled via in the first ceramic layer.

4. The multilayer ceramic substrate of claim 2 wherein a diameter of the metal-filled via in the first ceramic layer is equal to or greater than a diameter of the metal-filled via in the third ceramic layer.

5. The multilayer ceramic substrate of claim 1 wherein the metal-filled vias in the first and second ceramic layers comprise a copper/nickel alloy.

6. The multilayer ceramic substrate of claim 1 wherein the metal-filled vias in the first and second ceramic layers are 100 volume percent metal.

7. The multilayer ceramic substrate of claim 1 wherein the metal-filled vias in the first and second ceramic layers and the outer pad are 100 volume percent metal.

8. The multilayer ceramic substrate of claim 1 wherein the metal-filled via in the third ceramic layer is a composite via comprising a mixture of ceramic and metallic materials.

9. The multilayer ceramic substrate of claim 1 further comprising an interlayer pad between the metal-filled vias in the second and third ceramic layers.

10. A multilayer ceramic substrate with a single via anchored pad comprising:
    a first ceramic layer having a metal-filled via and an outer surface, the metal-filled via having a first contact surface;
    an outer pad adjacent to the outer surface of the first ceramic layer, the outer pad adhered to the metal-filled via in the first ceramic layer;
    a second ceramic layer adjacent to the first ceramic layer having a metal-filled via with a second contact surface, the metal-filled via in the second ceramic layer adhered to the metal-filled via in the first ceramic layer through the first and second contact surfaces, wherein the second contact surface is larger than the first contact surface and wherein there is only one metal-filled via in each of the first and second ceramic layers to anchor the outer pad to the multilayer ceramic substrate; and
    a third ceramic layer adjacent to the second ceramic layer having a metal-filled via adhered to the metal-filled via in the second ceramic layer.

11. The multilayer ceramic substrate of claim 10 wherein the contact surfaces in the first and second ceramic layer are circularly shaped.

12. The multilayer ceramic substrate of claim 11 wherein the contact surface in the second ceramic layer is at least two mils in diameter greater than the contact surface in the first ceramic layer.

13. The multilayer ceramic substrate of claim 11 wherein a diameter of the metal-filled via in the first ceramic layer is equal to or greater than the diameter of the metal-filled via in the third ceramic layer.

14. The multilayer ceramic substrate of claim 10 wherein the metal-filled vias in the first and second ceramic layers comprise a copper/nickel alloy.

15. The multilayer ceramic substrate of claim 10 wherein the metal-filled vias in the first and second ceramic layers are 100 volume percent metal.

16. The multilayer ceramic substrate of claim 10 wherein the metal-filled vias in the first and second ceramic layers and the outer pad are 100 volume percent metal.

17. The multilayer ceramic substrate of claim 10 wherein the metal-filled via in the third ceramic layer is a composite via comprising a mixture of ceramic and metallic materials.

18. The multilayer ceramic substrate of claim 10 further comprising an interlayer pad between the metal-filled vias in the second and third ceramic layers.

* * * * *